United States Patent
Kondo

(10) Patent No.: US 9,680,530 B2
(45) Date of Patent: Jun. 13, 2017

(54) NON-CONTACT POWER SUPPLY APPARATUS AND NON-CONTACT POWER SUPPLY SYSTEM

(71) Applicant: Kabushiki Kaisha Toyota Jidoshokki, Aichi-ken (JP)

(72) Inventor: Tadashi Kondo, Kariya (JP)

(73) Assignee: Kabushiki Kaisha Toyota Jidoshokki (JP)

( * ) Notice: Subject to any disclaimer, the term of this patent is extended or adjusted under 35 U.S.C. 154(b) by 298 days.

(21) Appl. No.: 14/359,457

(22) PCT Filed: Nov. 20, 2012

(86) PCT No.: PCT/JP2012/080083
§ 371 (c)(1),
(2) Date: May 20, 2014

(87) PCT Pub. No.: WO2013/077326
PCT Pub. Date: May 30, 2013

(65) Prior Publication Data
US 2014/0320079 A1    Oct. 30, 2014

(30) Foreign Application Priority Data

Nov. 24, 2011    (JP) .................................. 2011-256734

(51) Int. Cl.
*H02J 7/00* (2006.01)
*H04B 5/00* (2006.01)
(Continued)

(52) U.S. Cl.
CPC ............. *H04B 5/0037* (2013.01); *B60L 3/00* (2013.01); *B60L 3/12* (2013.01); *B60L 11/182* (2013.01);
(Continued)

(58) Field of Classification Search
CPC ...................................................... H02J 7/025
(Continued)

(56) References Cited

U.S. PATENT DOCUMENTS 7,310,245 B2 * 12/2007 Ohbo .................. H02M 3/3376
363/17
8,519,666 B2 * 8/2013 Terao ...................... H02J 7/025
320/108
(Continued)

FOREIGN PATENT DOCUMENTS

CN         101345437 A      1/2009
DE    10 2009 013694         9/2010
(Continued)

OTHER PUBLICATIONS

European Patent Application No. 12851367.8: Extended European Search Report dated Jan. 26, 2016, 8 pages.
(Continued)

*Primary Examiner* — Robert Grant
*Assistant Examiner* — Harry O'Neill-Becerril
(74) *Attorney, Agent, or Firm* — Baker & Hostetler LLP

(57) ABSTRACT

A non-contact power supply apparatus is configured to transmit power in a non-contact manner from a primary-side coil to a secondary-side coil by supplying alternating current power to the primary-side coil. The non-contact power supply apparatus is provided with an alternating current power output unit, a power transmitting unit, wiring, a detecting unit, and a determining unit. The alternating current power output unit is capable of outputting alternating current power. The power transmitting unit has the primary-side coil. The wiring electrically connects the alternating current power output unit and the power transmitting unit to each other. The detecting unit detects a ratio between an output voltage and an output current, which are outputted
(Continued)

from the alternating current power output unit, or a phase difference between the output voltage and the output current. On the basis of the ratio and/or the phase difference detected by means of the detecting unit, the determining unit determines whether an abnormality has generated or not in the non-contact power supply apparatus.

6 Claims, 1 Drawing Sheet

(51) Int. Cl.

| | | |
|---|---|---|
| H01M 10/46 | (2006.01) | |
| H01M 10/48 | (2006.01) | |
| B60L 11/18 | (2006.01) | |
| B60L 3/00 | (2006.01) | |
| B60L 3/12 | (2006.01) | |
| H02J 7/02 | (2016.01) | |
| H02J 50/12 | (2016.01) | |
| H02J 50/80 | (2016.01) | |
| G01R 31/40 | (2014.01) | |
| G01R 31/02 | (2006.01) | |
| G01R 31/06 | (2006.01) | |

(52) U.S. Cl.
CPC ....... *B60L 11/1824* (2013.01); *B60L 11/1829* (2013.01); *B60L 11/1833* (2013.01); *B60L 11/1846* (2013.01); *H01M 10/46* (2013.01); *H01M 10/48* (2013.01); *H02J 7/025* (2013.01); *H02J 50/12* (2016.02); *H02J 50/80* (2016.02); *B60L 2230/16* (2013.01); *B60L 2250/10* (2013.01); *G01R 31/026* (2013.01); *G01R 31/06* (2013.01); *G01R 31/40* (2013.01); *H01M 2220/20* (2013.01); *Y02T 10/7005* (2013.01); *Y02T 10/7088* (2013.01); *Y02T 90/121* (2013.01); *Y02T 90/122* (2013.01); *Y02T 90/125* (2013.01); *Y02T 90/128* (2013.01); *Y02T 90/14* (2013.01); *Y02T 90/163* (2013.01); *Y02T 90/169* (2013.01); *Y04S 30/14* (2013.01)

(58) Field of Classification Search
USPC ......................................................... 320/108
See application file for complete search history.

(56) References Cited

U.S. PATENT DOCUMENTS

| | | | |
|---|---|---|---|
| 2005/0223812 A1* | 10/2005 | Denis | ................. G01M 5/0033 |
| | | | 73/799 |
| 2009/0015197 A1 | 1/2009 | Sogabe et al. | |
| 2010/0244577 A1 | 9/2010 | Shimokawa | |
| 2011/0109263 A1* | 5/2011 | Sakoda | ................. B60L 11/182 |
| | | | 320/108 |
| 2011/0127846 A1* | 6/2011 | Urano | ..................... H02J 5/005 |
| | | | 307/104 |
| 2012/0187773 A1 | 7/2012 | Wechlin et al. | |
| 2012/0326662 A1 | 12/2012 | Matsumoto et al. | |

FOREIGN PATENT DOCUMENTS

| | | |
|---|---|---|
| DE | 10 2009 033239 | 1/2011 |
| EP | 0788212 | 8/1997 |
| JP | 02-095273 | 4/1990 |
| JP | 10-227827 | 8/1998 |
| JP | 2002-223521 | 8/2002 |
| JP | 2006-230032 | 3/2006 |
| JP | 2010-132088 | 6/2010 |
| JP | 2010-239690 A | 10/2010 |
| JP | 2011-229264 | 11/2011 |
| WO | WO 2007/008646 | 1/2007 |
| WO | WO 2010/036980 | 4/2010 |

OTHER PUBLICATIONS

Min, "Design of Wireless Energy-transferring Charger", Journal of Huanggang Polytechnic, Jun. 2009, vol. 11, No. 2, 2 pages.
International Patent Application No. PCT/JP2012/080083: International Preliminary Report on Patentability dated May 27, 2014, 8 pages.
Kurs et al., "Wireless Power Transfer via Strongly Coupled Magnetic Resonances", Science Magazine, Jul. 2007, vol. 317, 83-86.
Soljacic et al., "Wireless Technology Developed to Transmit Power Lights up a 60W Bulb in Tests", Nikkei Electronics, Dec. 3, 2007, 117-128.

* cited by examiner

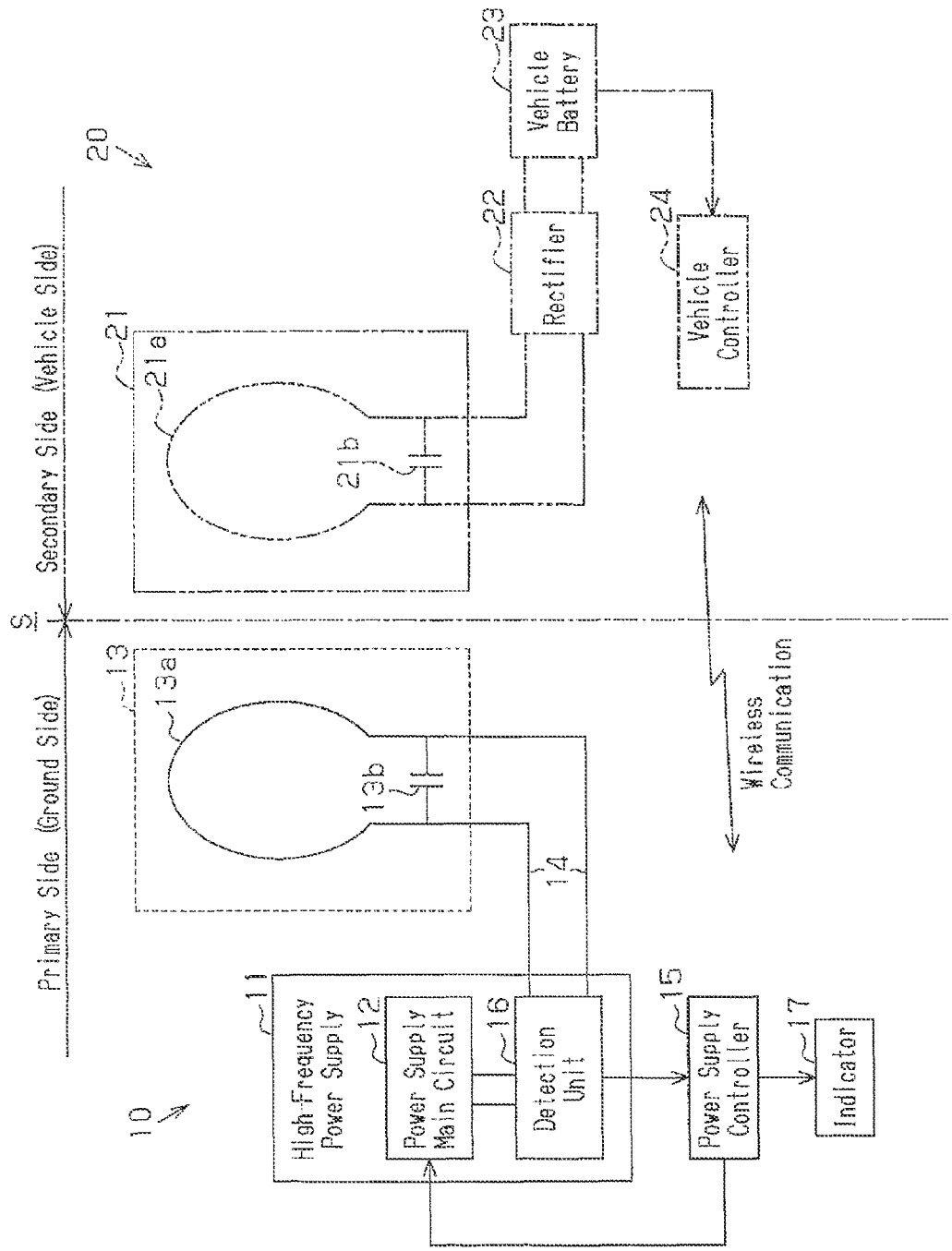

NON-CONTACT POWER SUPPLY APPARATUS AND NON-CONTACT POWER SUPPLY SYSTEM

CROSS-REFERENCE TO RELATED APPLICATIONS

This application is the National Stage of International Application No. PCT/JP2012/080083 filed Nov. 20, 2012, which claims the benefit of Japanese Application No. 2011-256734, filed Nov. 24, 2011, the disclosures of which are incorporated herein by reference in their entireties.

TECHNICAL FIELD

The present invention relates to a non-contact power supplying apparatus and a non-contact power supplying system.

BACKGROUND ART

Patent document 1 and non-patent document 1 each describe a known example of a non-contact power supplying apparatus capable of transmitting power in a non-contact manner to an appliance subject to power supplying. Such a non-contact power supplying apparatus includes a high-frequency power supply and a transmission side resonance circuit, which includes a primary coil and a primary capacitor. In this case, when the transmission side resonance circuit (primary coil) is spaced apart by a predetermined distance from a reception side resonance circuit (secondary coil), which has the same resonance frequency as the transmission side resonance circuit, the input of high-frequency power from the high-frequency power supply to the transmission side resonance circuit causes magnetic field resonance that transmits some of the high-frequency power to the reception side resonance circuit.

PRIOR ART DOCUMENT

Patent Document

Patent Document 1: International Patent Publication No. WO/2007/008646A2

Non-Patent Document

Non-Patent Document 1: NIKKEI ELECTRONICS 2007.12.3 Pgs. 117-128

SUMMARY OF THE INVENTION

When an abnormality occurs in the non-contact power supplying apparatus for one reason or another, the transmission efficiency may be decreased. Thus, the non-contact power supplying apparatus needs to detect abnormalities in a preferable manner. The same applies to a non-contact power supplying apparatus that supplies power in a non-contact manner through electromagnetic induction.

It is an object of the present invention to provide a non-contact power supplying apparatus capable of detecting abnormalities in a preferable manner and a non-contact power supplying system using the non-contact power supplying apparatus.

To achieve the above object, one aspect of the present invention is a non-contact power supplying apparatus configured to supply a primary coil with AC power to transmit power in a non-contact manner from the primary coil to a secondary coil. The non-contact power supplying apparatus includes an AC power output unit, a power transmission unit, a cable, a detector, and a determination unit. The AC power output unit is capable of outputting AC power. The power transmission unit includes the primary coil. The cable electrically connects the AC power output unit and the power transmission unit. The detector detects a ratio of an output voltage and an output current output from the AC power output unit or a phase difference of the output voltage and the output current. The determination unit determines whether or not an abnormality is occurring in the non-contact power supplying apparatus based on at least one of the ratio and the phase difference detected by the detector.

In the above configuration, changes in the resistance or inductance of an AC power transmission system including the AC power output unit, the power transmission unit, and the cable are detected as the ratio of the output voltage and the output current or the phase difference of the output voltage and the output current. The determination, of whether or not an abnormality is occurring based on the detection result of the detector allows for detection of an abnormality in the AC power transmission system such as an abnormality in the power transmission unit like deformation of the primary coil and an abnormality in the cable, or an abnormality in the AC power output unit. In particular, the output voltage and the output current are detected relatively easily. Thus, an abnormality may be detected in the non-contact power supplying apparatus with a relatively simple configuration.

Preferably, each of the primary coil, and the cable includes bundled conductive wires. The determination unit determines from at least one of the ratio and the phase difference whether or not at least one of the primary coil and the cable is partially broken or determines from the phase difference whether or not the primary coil is deformed.

In the above configuration, the formation of the primary coil and the cable with conductive wires limits energy losses caused by the skin effect that may occur when using AC power. In this case, the primary coil and the cable may be partially broken in which some of the conductive wires break or the primary coil may be deformed. In particular, when the distance changes between the primary coil and the secondary coil, the change lowers the power transmission efficiency and the primary coil and the cable covert the AC power to heat. The heat may easily cause partial wire breakage such as that described above.

In this regard, to determine whether or not an abnormality is occurring, the above configuration uses the ratio of the output voltage and the output current or the phase difference of the output voltage and the output current to detect a change in the resistance based on a partial wire breakage or a change in the inductance based on deformation of the primary coil. Thus, an abnormality such as a partial wire breakage or deformation of the primary coil may be detected in a suitable manner.

Preferably, the determination unit determines that at least one of the primary coil and the cable is partially broken when the ratio of the output current to the output voltage is a value other than zero and lower than a threshold set in advance.

Preferably, the determination unit determines that at least one of the primary coil and the cable is partially broken when the phase difference is in a specified range.

Preferably, the determination unit determines that the primary coil is deformed when the ratio of the output current to the output voltage is a value other than zero and higher than a threshold set in advance.

Preferably, the determination unit determines that the primary coil is deformed when the phase difference is outside a specified range set in advance.

Preferably, the non-contact power supplying apparatus further includes a control unit that controls the AC power output unit so that AC power for determining an abnormality is output when the secondary coil is not located at a position where power is receivable from the primary coil. The determination unit performs the determination based on the detection result of the detector when the AC power for determining an abnormality is output.

The above configuration allows for determination of whether or not the non-contact power supplying apparatus includes an abnormality before starting power supplying. Thus, an abnormality in the non-contact power supplying apparatus may be recognized at a relatively early stage. This allows for repairs and replacements to be readily performed.

Further, when the secondary coil is not arranged at the position where power is receivable from the primary coil, the mutual effect of the primary coil and the secondary coil has a small influence on abnormality determination. Thus, there is no need to consider the influence of the mutual effect during abnormality determination. This allows for an improvement in the accuracy of the abnormality determination and allows for the non-contact power supplying apparatus to be specified as being abnormal when an abnormality is determined during an abnormality determination.

Preferably, a non-contact power supplying system is provided including the non-contact power supplying apparatus of the above aspect. The non-contact power supplying system transmits the AC power to the secondary coil that is arranged in a vehicle and charges a vehicle battery arranged in the vehicle with the AC power received by the secondary coil.

In comparison with a battery for a cellular phone, a vehicle battery is required to have a large capacitance. Thus, it may be expected that a relatively large amount of power is involved in a vehicle non-contact power supplying apparatus for a non-contact power supplying system that charges a vehicle battery. Further, the relative position of the vehicle and the vehicle non-contact power supplying apparatus easily changes in accordance with the parking position of the vehicle. Thus, energy losses easily generate heat in the primary coil and the cable. Further, it may be assumed that a person or a vehicle, which is heavier than a person, will be arranged on the primary coil or cable of the vehicle non-contact power supplying apparatus. Thus, there is a tendency of a relatively large load being applied to the primary coil and the cable. Accordingly, in the vehicle non-contact power supplying apparatus, an abnormality such as a partial breakage or deformation of the primary coil may occur.

In this regard, the above configuration allows for early detection of an abnormality such as a partial damage or deformation of the primary coil in the vehicle non-contact power supplying apparatus. This provides a vehicle non-contact power supplying system that allows for an abnormality to be detected in a preferable manner when charging a vehicle battery with the vehicle non-contact power supplying apparatus.

BRIEF DESCRIPTION OF THE DRAWING

The FIGURE is a block circuit diagram showing the electric configuration of a non-contact power supplying system using a non-contact power supplying apparatus according to one embodiment of the present invention.

DETAILED DESCRIPTION OF THE PREFERRED EMBODIMENTS

One embodiment of the present invention will now be described with reference to the FIGURE.

As shown in the FIGURE, a non-contact power supplying system S, which performs power transmission or charging in a non-contact manner, includes a non-contact power supplying apparatus 10, which is arranged on the ground, and an onboard apparatus 20, which is arranged in a vehicle.

The non-contact power supplying apparatus 10 is configured to be capable of supplying power in a non-contact manner to the onboard apparatus 20. In detail, the non-contact power supplying apparatus 10 includes a high-frequency power supply 11 as an AC power supply connected to an external power supply such as a commercial power supply. The high-frequency power supply 11 includes a power supply main circuit 12 as an AC power output unit. The power supply main circuit 12 is configured to convert power input from an external power supply to high-frequency power having a predetermined frequency and is capable of, outputting the converted high-frequency power as an AC power.

The non-contact power supplying apparatus 10 includes a power transmission circuit 13 as a power transmission unit that transmits power in a non-contact manner to the onboard apparatus 20. A cable 14, which is formed by a Litz wire, electrically connects the power transmission circuit 13 to the power supply main circuit 12. A Litz wire is a bundle of conductive wires, e.g., copper wires). The power transmission circuit 13 includes a primary coil 13a, which is formed by a Litz wire, and a primary capacitor 13b, which is connected in parallel to the primary coil 13a. The power transmission circuit 13 resonates when receiving high-frequency power.

The onboard apparatus 20 includes a power reception circuit 21 as a power reception unit. The power reception circuit 21 is configured so that magnetic field resonance may occur with the power transmission circuit 13. In detail, like the power transmission circuit 13, the power reception circuit 21 includes a secondary coil 21a and a secondary capacitor 21b that are connected to each other in parallel. The power reception circuit 21 and the power transmission circuit 13 are set to have the same resonance frequency. Thus, when the power transmission circuit 13 receives high-frequency power, magnetic field resonance occurs in the power transmission circuit 13 and the power reception circuit 21, and power is transmitted from the power transmission circuit 13 to the power reception circuit 21, that is the power is transmitted from the primary coil 13a to the secondary coil 21a.

The onboard apparatus 20 includes a rectifier 22 and a vehicle battery 23. The rectifier 22 rectifies the high-frequency power received by the power reception circuit 21. The vehicle battery 23 is electrically connected to the rectifier 22. The DC power rectified by the rectifier 22 is input to the vehicle battery 23. This charges the vehicle battery 23.

The non-contact power supplying apparatus 10 includes a power supply controller 15, which serves as a control unit that controls the power supply main circuit 12. The onboard apparatus 20 includes a vehicle controller 24 that controls the charging of the vehicle battery 23. The vehicle controller 24 is configured to be capable of recognizing the state of charge of the vehicle battery 23. Each of the controllers 15 and 24 are configured to be capable of performing wireless communication with each other so that information can be transferred between the two.

When the vehicle is arranged at a chargeable position, which is a power transmittable position, more specifically, at a position allowing for magnetic field resonance to occur between the power transmission circuit 13 and the power reception circuit 21, that is between the primary coil 13a and the secondary coil 21a, the vehicle controller 24 transmits a charge enablement signal to the power supply controller 15. When the power supply controller 15 receives the charge enablement signal, the power supply controller 15 controls the power supply main circuit 12 so that the power supply main circuit 12 outputs high-frequency power. In detail, the power supply controller 15 exchanges signals with the vehicle controller 24 to determine whether or not the power transmission circuit 13 and the power reception circuit 21 are located at positions allowing for power transmission, that is, whether or not the vehicle exists. Then, the power supply controller 15 controls the power supply main circuit 12 based on the determination.

When the charging of the vehicle battery 23 is completed, the vehicle controller 24 transmits a charge completion signal, that is, a charge end signal to the power supply controller 15. The power supply controller 15 controls the power supply main circuit 12 to stop the output of the high-frequency power when receiving the charge completion signal.

The occurrence of an abnormality in the primary coil 13a or the like of the non-contact power supplying apparatus 10 lowers the charging efficiency of the vehicle battery 23. This may prolong the charging time or consume unnecessary' power.

In this regard, the non-contact power supplying apparatus 10 includes a structure that periodically detects abnormalities. The structure will now be described.

The non-contact power supplying apparatus 10 includes a detection unit 16. The detection unit 16 detects the output voltage that is output from the power supply main circuit 12, the output current that is output from the power supply main circuit 12, and the phase difference between the output voltage and the output current. The output voltage corresponds to a voltage applied to the power transmission circuit 13. The output current corresponds to a current flowing through the power transmission circuit 13. Then, the detection unit 16 outputs the detection result to the power supply controller 15.

Based on the detection result of the detection unit 16, the power supply controller 15 periodically determines whether or not an abnormality is occurring in the power transmission circuit 13 or the cable 14. Accordingly, the power supply controller 15 functions as a determination unit that determines whether or not an abnormality is occurring in the power transmission circuit 13 or the cable 14. More specifically, the power supply controller 15 first determines whether or not communication can be established with the vehicle controller 24 in a cycle that is set in advance.

The maximum distance in which the controllers 15 and 24 are capable of communicating with each other is set in advance. The maximum distance is a distance greater than the distance between the controllers 15 and 24 when the vehicle is located at a chargeable position, that is, when the coils 13a and 21a are located at positions allowing for the occurrence of magnetic field resonance. Thus, the determination of whether or not communication can be established with the vehicle controller 24 is equivalent to a determination of whether or not the vehicle is located at a chargeable position, that is whether or not the secondary coil 21a is located at a position where power may be received from the primary coil 13a.

When communication cannot be established, this indicates that the vehicle does not exist at the chargeable position. In this case, the power supply controller 15 controls the power supply main circuit 12 to output high-frequency power for abnormality determination, which is lower than the high-frequency power, over a predetermined period. The detection unit 15 detects the output voltage and output current of the power supply main circuit 12 and the phase difference of the output voltage and current. Then, the detection unit 16 outputs the detection result to the power supply controller 15.

The high-frequency power used for abnormality determination may be supplied in any amount as long as the frequency is the same as the high-frequency power used for charging. For example, the amount of the high-frequency power used for abnormality determination may be the same as the high-frequency power used for charging.

The power supply controller 15 determines whether or not an abnormality is occurring based on the detection result. In detail, the power supply controller 15 calculates the ratio of the output current relative to the output voltage and determines whether or not the calculated ratio is a value other than "0" and is lower than a threshold, which is set in advance. The threshold is a ratio that is lower by an amount set in advance than the ratio of the output current relative to the output voltage when the abnormality determination high-frequency power is output under a situation in which the power transmission circuit 13 and the cable 14 do not include an abnormality, that is an initial state, and there are no items such as metal magnetically coupled to the power transmission circuit 13 near the power transmission circuit 13 in other words, the threshold is the lower limit value of a range that can be considered as normal operation.

When the calculated ratio is a value other than "0" and is lower than the threshold, the power supply controller 15 uses an indicator 17, which is connected to the power supply controller 15, to indicate that there is an abnormality. The indicator 17 is formed by, for example, a light emitting unit that emits light when indicating an abnormality. However, as long as an abnormality can be indicated, the indicator 17 may have any form. For example, the indicator 17 may have a structure that generates a sound or a structure using a display that shows characters of the like to indicate an abnormality.

The power supply controller 15 determines whether or not the phase difference between the output voltage and the output current is in a specified range, which is set in advance. When the detected phase difference is outside the specified range, the power supply controller 15 uses the indicator 17 to indicate an abnormality. The specified range includes phase differences for when the abnormality determination high-frequency power is output under a situation in which there is no abnormality in the power transmission circuit 13 and there is no item near the power transmission circuit 13 that is magnetically coupled to the power transmission circuit 13.

The function of the detection unit 16 for detecting the output voltage and the output current and the function of the power supply controller 15 for calculating the ratio correspond to a function of a detector that detects the ratio of the output voltage and the output current that are output from the AC power output unit.

The operation of the non-contact power supplying apparatus of the present embodiment will now be described.

When a partial wire breakage occurs in the primary coil 13a or the cable 14 etc., it may be assumed that the resistance will increase at the location of the partial wire breakage. When the primary coil 13a is deformed, depending on the deformation, the resistance of the primary coil 13a may be increased. Thus, when a partial wire breakage or deformation of the primary coil 13a occurs, the resistance (load) as viewed from the high-frequency power supply 11 may increase. An increase in the resistance decreases the ratio of the output current to the output voltage. Thus, the determination of the comparison of the ratio and the threshold is equivalent to the abnormality determination of whether a partial wire breakage is occurring in the primary coil 13a or the cable 14 etc. or whether the primary coil 13a is deformed.

A partial wire breakage refers to a condition in which there is electrical connection but a wire breakage in a certain portion increases the resistance at that portion. More specifically, a partial wire breakage refers to a condition in which some of the bundled conductive wires in the cable 14 and the primary coil 13a are broken.

When the calculated ratio is "0", there is a high probability of a complete wire breakage and not a partial wire breakage, that is, there is a high probability of no electric connection. Thus, when performing an abnormality determination with the above ratio, a complete wire breakage may be distinguished from a partial wire breakage by using the factor that the calculated ratio is a value other than "0" as a condition.

When the primary coil 13a is deformed, it may be assumed that the inductance of the primary coil 13a has changed. A change in the inductance changes the phase difference of the output voltage and the output current. Thus, the determination of whether or not the phase difference is in the specified range is equivalent to an abnormality determination of whether or not the primary coil 13a is deformed.

The power supply controller 15 is configured to perform the abnormality determination when the vehicle is not located at the chargeable position. This allows for the abnormality determination to be performed on the non-contact power supplying apparatus 10 before starting the charging of the vehicle. Accordingly, the charging is not started when there is an abnormality in the non-contact power supplying apparatus 10.

A situation in which the vehicle is not located at the chargeable position is equivalent to a situation in which the onboard apparatus 20 and the non-contact power supplying apparatus 10 are separated from each other such that power cannot be transmitted between the two, more specifically, a situation in which the primary coil 13a and the secondary coil 21a are separated by a distance in which magnetic field resonance substantially does not occur between the primary coil 13a and the secondary coil 21a. Thus, when performing abnormality determination, there is no need to take into consideration factors resulting from the mutual effect of the primary side, that is the non-contact power supplying apparatus 10, and the secondary side, that is the onboard apparatus 20), such as a change in the inductance or a change in the output current caused by a change in the distance between the primary coil 13a and the secondary coil 21a.

A partial wire breakage changes the resistance. However, the inductance does not easily change. Thus, under a situation in which the ratio of the output current to the output voltage is lower than the threshold, when the phase difference is in the specified range, there is a higher probability of a partial wire breakage than deformation of the primary coil 13a. Under a situation in which the ratio of the output current to the output voltage is higher than the threshold, when the phase difference is outside the specified range, there is a higher probability of deformation of the primary coil 13a than a partial wire breakage. In this manner, the cause of an abnormality may be narrowed down by a certain extent by combining the abnormality determination result based on the ratio and the abnormality determination result based on the phase difference.

The present embodiment has the advantages described below.

(1) In the configuration that electrically connects the power supply main circuit 12 and the power transmission circuit 13 with the cable 14, the detection unit 16 detects the output voltage that is output from the power supply main circuit 12, the output current that is output from the power supply main circuit 12, and the phase difference of the output voltage and the output current. An abnormality determination of whether or not an abnormality is occurring in at least one of the power transmission circuit 13 and the cable 14 is performed based on the detection result of the detection unit 16. This allows for a change in the resistance or inductance of the power transmission circuit 13 and the cable 14 to be detected as the ratio of the output voltage and the output current or a phase difference of the output voltage and the output current. Further, by performing the abnormality determination based on the detection result, an abnormality in the power transmission circuit 13 such as deformation of the primary coil 13a and an abnormality in the non-contact power supplying apparatus 10 such as an abnormality in the cable 14 may be detected in a preferable manner. In particular, the detection unit 16 that detects the output voltage, the output current, and the phase difference is simpler than a configuration that detects impedance. Thus, an abnormality in the non-contact power supplying apparatus 10 may be detected in a preferable manner with a relatively simple structure.

(2) Since non-contact power supplying is performed through magnetic field resonance, there is a need to supply the first primary coil 13a and the cable 14 with high-frequency power. This may increase energy losses due to the skin effect. In this regard, the present embodiment forms the cable 14 and the primary coil 13a by bundling conductive wires to increase the surface area and limit increases in energy losses. In this case, a partial wire breakage may occur in which a wire breakage occurs in some of the conductive wires of the primary coil 13a or the cable 14. Further, deformation of the primary coil 13a may occur. In particular, the vehicle non-contact power supplying apparatus 10 used in the non-contact power supplying system S that, charges the vehicle battery 23 involves a large amount of power as compared with a power supplying apparatus for a cellular phone or the like. Further, the distance between the primary coil 13a and the secondary coil 21a easily changes, and a change in the distance easily decreases the power transmission efficiency. In this case, the high-frequency power from the power supply main circuit 12 is easily converted to heat in the primary coil 13a and the cable 14. Further, a person or a vehicle, which is heavier than a person, is arranged on the primary coil 13a and the cable 14 of the vehicle non-contact power supplying apparatus 10. Thus, there is a tendency of a relatively large load being applied to the primary coil 13a and the cable 14. Consequently, in the vehicle non-contact power supplying apparatus 10, due to heat and load, partial wire breakage and deformation of the primary coil 13a tend to occur easily.

In this regard, the present embodiment allows for early detection of partial wire breakage and deformation of the primary coil 13a that may easily cause a problem in the vehicle non-contact power supplying apparatus 10. Thus, the vehicle non-contact power supplying apparatus 10 allows for abnormality detection to be performed in a preferable manner. Further, by using the non-contact power supplying apparatus 10 to charge the vehicle battery 23, the non-contact power supplying system S, that is the non-contact charger, may perform abnormality detection in a preferable manner.

(3) Abnormality determination is performed when the vehicle is not located at the chargeable position, more specifically, when the secondary coil 21a is not located at a position where power is receivable from the primary coil 13a. This allows for determination of whether or not the non-contact power supplying apparatus 10 includes an abnormality before the charging is started. Thus, an abnormality in the non-contact power supplying apparatus 10 may be recognized at a relatively early stage. This allows for repairs and replacements to be readily performed.

Further, when the secondary coil 21a is not located at a position where power is receivable from the primary coil 13a, the mutual effect of the primary coil 13a and the secondary coil 21a may be ignored. Thus, during abnormality determination, there is no need to consider such mutual effect, and there is no need to consider abnormalities in the onboard apparatus 20. This increases the abnormality determination accuracy. Further, when an abnormality is determined during abnormality determination, the non-contact power supplying apparatus 10 may be specified as being abnormal.

(4) The abnormality determination is periodically performed when the vehicle is not located, at the chargeable position and there is no need for a user operation. Thus, an abnormality may be detected easily and quickly.

The above embodiment may be modified as follows.

The embodiment described magnetic field resonance type non-contact power supplying. Instead, the present invention may be applied to, for example, electromagnetic induction type non-contact power supplying.

In the embodiment, the cable 14 connects the power supply main circuit 12 and the power transmission circuit 13. Instead, for example, the cable 14 may connect the power supply main circuit 12 with a coupling coil, and the coupling coil may be coupled through electromagnetic induction with the power transmission circuit 13. In this case, by performing abnormality determination, an abnormality may be detected in the cable 14 and at least one of the coupling coil and the power transmission circuit 13. In the above configuration, the coupling coil and the power transmission circuit 13 correspond to a power transmission unit.

The embodiment includes the primary capacitor 13b and the secondary capacitor 21b. However, the primary capacitor 13b and the secondary capacitor 21b may be omitted. In this case, parasitic capacitance of the primary coil 13a and the secondary coil 21a may be used to cause magnetic field resonance.

The magnetic field resonance may be set to a suitable resonance frequency, and the frequency of the high-frequency power output from the high-frequency power supply 11 may be set accordingly. In other words, instead of the high-frequency power. AC power having a predetermined frequency, e.g., 10 kHz to 10 MHz may be used.

In the embodiment, the power supply controller 15 determines whether or not the secondary coil 21a is located at a position where power is receivable from the primary coil 13a based on whether or not communication may be established with the vehicle controller 24. Instead of performing the determination with such a configuration, for example, the non-contact power supplying apparatus 10 may include any type of a sensor, such as an image sensor, to detect whether or not the vehicle is located at a chargeable position, and the determination may be performed based on the detection result of the sensor. In this case, the non contact power supplying apparatus 10 may recognize the presence of the vehicle when communication cannot be established between the controllers 15 and 24 even though they are within the communicable distance.

In the embodiment, the power supply controller 15 is configured to perform abnormality determination using the ratio of the output current to the output voltage and abnormality determination using the phase difference. Instead, the power supply controller 15 may be configured to perform only one of these abnormality determinations. However, to narrow the cause of the abnormality, it is preferable that both abnormality determinations be performed.

In the embodiment, the detection unit 16 detects the output voltage and the output current and detects the phase difference of the output voltage and current. Instead, the phase difference may not be detected, and only the output voltage and the output current or only the ratio of the output current to the output voltage may be detected.

In the embodiment, the power supply controller 15 is configured to calculate the ratio of the output current to the output voltage. Instead, for example, the detection unit 16 may be configured to calculate the ratio and output the calculation result to the power supply controller 15. As long as the ratio can be detected, any configuration may be employed.

In the embodiment, the indicator 17 is used to indicate an abnormality. Instead, for example, the vehicle may indicate an abnormality. In this case, when the power supply controller 15 becomes communicable with the vehicle controller 24, the power supply controller 15 transmits a signal indicating an abnormality to the vehicle controller 24. When receiving the signal, the vehicle controller 24 uses a predetermined indicator to indicate the abnormality. The predetermined indicator may be an additional separate indicator or may be an existing device, such as a car navigation device that indicates the abnormality on a display or the like.

In the embodiment, the primary coil 13a is formed by a Litz wire, in which conductive wires are bundled. Instead, the primary coil 13a may be formed by, for example, a single conductive wire. In this case, when the conductive wire partially breaks, the resistance at the broken portion can be expected to increase greatly. Nevertheless, it is preferable that a Litz wire be used to limit increases in energy losses caused by the skin effect.

In the embodiment, when the phase difference of the output voltage and the output current is outside a specified range under a situation in which the ratio of the output current to the output voltage is smaller than the threshold, the power supply controller 15 determines the occurrence of a deformation in the primary coil 13a. Instead, an abnormality in the primary capacitor 13b may be determined.

In the embodiments, the power supply controller 15 detects the abnormalities in the cable 14 and the power transmission circuit 13 based on the detection result from the detection unit 15. Instead, the power supply controller 15 may detect an abnormality in the power supply main circuit 12 based on the detection result.

In the embodiments, fixed values are used for the threshold and the specified range. Instead, the threshold and the specified range may be varied in accordance with factors such as chronological wear or ambient temperature. In this Case, even when the output voltage and the output current is changed by the above factors when the high-frequency power for abnormality determination is output under a situation in which the vehicle is located at a chargeable position, the change may be coped with in a preferable manner.

In the embodiment, the vehicle battery 23 is arranged in the onboard apparatus 20, and the power transmitted in a non-contact manner from the power supply main circuit 12 is used to charge the vehicle battery 23. Instead, for example, the power may be used to operate a different electronic appliance such as the vehicle controller 24.

In the embodiment, the power reception circuit 21, which includes the secondary coil 21a used for non-contact power transmission, is installed in the vehicle but instead may be installed in, for example, a cellular phone. Any appliance may be subject to the power transmission.

The invention claimed is:

1. A non-contact power supplying apparatus configured to supply a primary coil with AC power to transmit power in a non-contact manner from the primary coil to a secondary coil, the non-contact power supplying apparatus comprising:
    an AC power output unit capable of outputting AC power;
    a power transmission unit including the primary coil;
    a cable electrically connecting the AC power output unit and the power transmission unit;
    a detector that detects a ratio of an output voltage and an output current output from the AC power output unit and a phase difference of the output voltage and the output current; and
    a determination unit that determines whether or not an abnormality is occurring in the non-contact power supplying apparatus based on at least one of the ratio and the phase difference detected by the detector, wherein
    each of the primary coil and the cable includes bundled conductive wires, and
    the determination unit determines that at least one of the primary coil and the cable is partially broken when the ratio of the output current to the output voltage is a value other than zero and lower than a threshold set in advance and when the phase difference is in a specified range.

2. The non-contact power supplying apparatus according to claim 1, further comprising a control unit that controls the AC power output unit so that AC power for determining an abnormality is output when the secondary coil is not located at a position where power is receivable from the primary coil,
    wherein the determination unit performs the determination based on the detection result of the detector when the AC power for determining an abnormality is output.

3. A non-contact power supplying system comprising the non-contact power supplying apparatus according to claim 1, wherein the non-contact power supplying system transmits the AC power to the secondary coil that is arranged in a vehicle and charges a vehicle battery arranged in the vehicle with the AC power received by the secondary coil.

4. A non-contact power supplying apparatus configured to supply a primary coil with AC power to transmit power in a non-contact manner from the primary coil to a secondary coil, the non-contact power supplying apparatus comprising:
    an AC power output unit capable of outputting AC power;
    a power transmission unit including the primary coil;
    a cable electrically connecting the AC power output unit and the power transmission unit;
    a detector that detects a ratio of an output voltage and an output current output from the AC power output unit and a phase difference of the output voltage and the output current; and
    a determination unit that determines whether or not an abnormality is occurring in the non-contact power supplying apparatus based on at least one of the ratio and the phase difference detected by the detector, wherein
    each of the primary coil and the cable includes bundled conductive wires, and
    the determination unit determines that the primary coil is deformed when the ratio of the output current to the output voltage is a value other than zero and higher than a threshold set in advance and when the phase difference is outside a specified range set in advance.

5. The non-contact power supplying apparatus according to claim 4, further comprising a control unit that controls the AC power output unit so that AC power for determining an abnormality is output when the secondary coil is not located at a position where power is receivable from the primary coil,
    wherein the determination unit performs the determination based on the detection result of the detector when the AC power for determining an abnormality is output.

6. A non-contact power supplying system comprising the non-contact power supplying apparatus according to claim 4, wherein the non-contact power supplying system transmits the AC power to the secondary coil that is arranged in a vehicle and charges a vehicle battery arranged in the vehicle with the AC power received by the secondary coil.

* * * * *